United States Patent [19]
Washizuka et al.

[11] 3,834,616
[45] Sept. 10, 1974

[54] MULTIPLEXING CONNECTION BETWEEN A KEY BOARD AND AN INTEGRATED CIRCUIT DEVICE

[75] Inventors: Isamu Washizuka, Kyoto; Masaru Kaumae, Yamatokoriyama, both of Japan

[73] Assignee: Sharp Kabushiki Kaisha, Osaka, Japan

[22] Filed: Sept. 13, 1972

[21] Appl. No.: 288,493

[30] Foreign Application Priority Data

Sept. 13, 1971 Japan .............................. 46-71082

[52] U.S. Cl. .................. 235/160, 235/159, 340/365
[51] Int. Cl. ....................... G06f 3/02, H03k 13/256
[58] Field of Search .................... 235/160, 159, 156; 340/365, 172.5, 347 DD; 178/80

[56] References Cited

UNITED STATES PATENTS

| | | | |
|---|---|---|---|
| 3,293,640 | 12/1966 | Chalfin et al. | 340/365 |
| 3,466,647 | 9/1969 | Guzak, Jr. | 340/365 |
| 3,624,376 | 11/1971 | Kitz | 235/160 |
| 3,715,746 | 2/1973 | Hatano | 340/347 DD X |

*Primary Examiner*—Malcolm A. Morrison
*Assistant Examiner*—David H. Malzahn
*Attorney, Agent, or Firm*—Stewart and Kolasch, Ltd.

[57] ABSTRACT

The present disclosure is directed to a multiplexing connection arrangement for use between a key board and an integrated circuit device for introducing key signals into the integrated circuit. The arrangement enables multiplexing transmission between the keyboard and the integrated circuit device with a reduction of the necessary number of connection terminals integrated circuit device for receiving the key input information. The individual key information is respectively taken out from the key board at different timing intervals not overlapping each other in time. Addition is repeatedly carried out during the period beginning at the appearance of the key signals and ending at a time boundary marker, so that the key inputs are introduced in a binary fashion into the integrated circuit through the minimum connection terminals. The arrangement is used in desk-top electronic calculators, electronic price-computing scales, electronic cash registers, etc.

14 Claims, 10 Drawing Figures

MULTIPLEXING CONNECTION BETWEEN A KEY BOARD AND AN INTEGRATED CIRCUIT DEVICE

BACKGROUND OF THE INVENTION

This invention relates to a multiplexing connection arrangement between a key board and an integrated circuit device, and more particularly to an improved arrangement which is capable of transferring key inputs in a binary fashion to sub circuits within the integrated circuit device through at least one connection terminal. Electronic calculators, electronic cash registers and so forth are, in essence, provided with key boards for entering numeral information and function information into an arithmetic operation unit and its associated units. Of course, the key board includes manually operated digit keys for entering the numeral information, and manually operated function keys for controlling the arithmetic operation such as addition, subtraction, multiplication and division. These keys have inherent tasks for instructing different entries of numeral or functional information. To this end, the key inputs should be separately introduced into the arithmetic operation unit and its associated unit and thus it is impossible in theory to commonly connect these keys with a single connection terminal. However, these limitations impose a serious packaging and expensive cost problem on the construction of integrated or large-scale integrated circuit devices. According to a conventional mode, the coupling of key inputs between the key board and the integrated circuit device has been achieved by providing a separate connection terminal for each key and each inlet of the integrated circuit device. Consequently, in such an arrangement the number of connection terminals on the integrated circuit device is increased directly in proportion with increases in the number of keys.

OBJECTS AND SUMMARY OF THE INVENTION

Accordingly, the primary object of this invention is to provide an improved multiplexing connection arrangement between a key board and an integrated circuit device which avoids one or more of the disadvantages and limitations of the above discussed conventional arrangements.

Another object of this invention is to provide an efficient and effective multiplexing connection arrangement suitable for the coupling the output from a key activated device to an integrated or large-scale integrated circuit device having a limited number of connection terminals on the package.

Still another object of this invention is to provide a multiplexing connection arrangement between a key board and an integrated circuit device in which the necessary number of package terminals for exterior connection is reduced.

A further object of this invention is to provide a multiplexing connection arrangement between a key board and an integrated circuit device where individual key inputs are introduced in multiplexing mode into the integrated circuit device through a common connection path.

Another object of this invention is to provide a multiplexing connection arrangement in the form of a circuit system which achieves multiplexing transmission between a key board and an integrated circuit device without increasing the expenditure on circuit construction.

It is still a further object of this invention is to provide a multiplexing connection arrangement between a key board and an integrated circuit device which is capable of entering the key input information in a binary fashion into the integrated circuit device.

In summary, this invention relates primarily to an improved multiplexing connection arrangement comprising a key board including a plurality of keys, means for delivering individual key signals from the keys at different timing intervals, the delivering means being connected to the keys, an integrated circuit device for receiving the individual key signals, common connection means between the delivering means and the integrated circuit device for introducing the individual key signals into the integrated circuit device, and means for identifying the individual key signals by the differences in time between the delivered key signals, the identifying means being incorporated into the integrated circuit device.

In order to achieve these objects, this invention, in a preferred embodiment, utilizes means for generating a time reference and binary adding means for repeatedly carrying out binary addition during the time interval between the delivered key signal and the time reference. The time period is different for the individual key signals and thus the key signals are identified by the different time periods. The differences in time between the individual key signals and the time reference are respectively translated into binary coded information through the binary adding means. Therefore there is no need for establishing an encoding matrix arrangement. The timing generator and the binary adder are indispensable constituents for electronic desk calculators and so forth and also in this invention are applied to the purpose of coupling key signals. As a consequence, the invention permits a reduction in the number of package terminals for exterior connection by enabling multiplex coupling of key signals.

These and other objects and novel features of this invention are set forth in the appended claims and this invention as to its organization and its mode of operation will best be understood from a consideration of the following detailed description of the preferred embodiments when considered in connection with the accompanying drawings.

DESCRIPTION OF THE PREFERRED EMBODIMENTS

The following description is directed to an exemplary electronic calculator embodying the key signal coupling arrangement constructed in accordance with this invention. The coupling arrangement may be applied to electronic pricecomputing scales, electronic cash registers and other digital equipments provided with key boards. As already noted, one feature of this invention is that a train of timing signals (such as T1 through Tn shown in (FIG. 3) having different intervals not overlapping each other in time, are employed to distinguish a selected key signal from other non-selected key signals, and in transmitting key signals in code configuration into the integrated circuit device.

Figure 3:
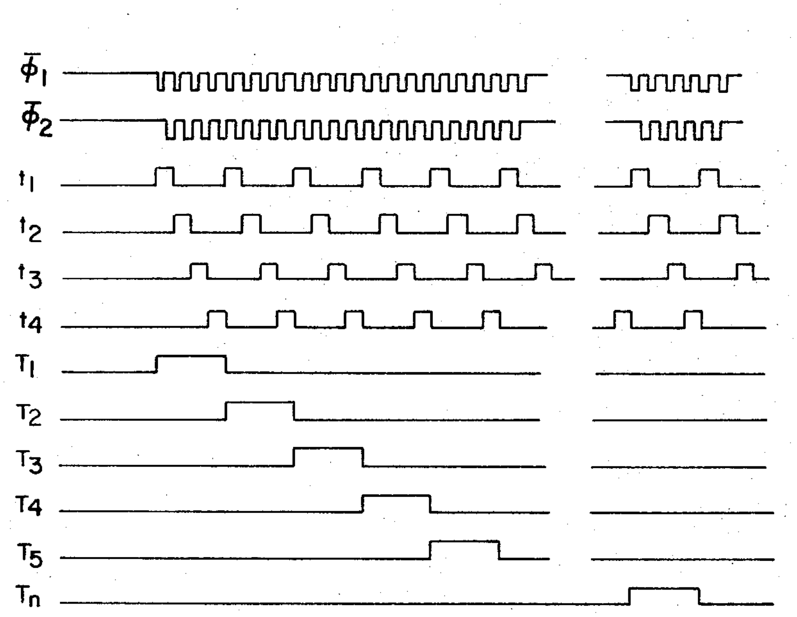
FIG. 3 is a time chart illustrating the time relation between various timing signals used in the key signal coupling arrangement of FIG. 1.

Prior to explanation of the organization and mode of operation as to the multiplexing coupling of key signals, various timing signals used therein will be now described with reference to FIG. 3.

It is preferred that the integrated circuit device for receiving individual key signals contain MOS type field effect transistor devices. Flip-flops or registers within the integrated circuit device are made up of the MOS devices (not shown in the drawings) are controlled by two-phase clock or timing signals $\phi 1$ and $\phi 2$ due to limited memory capabilities. Alternatively, four-phase or three-phase clock or timing systems may be applied to control write and read operations of information into and out of the flip-flops or registers. In the case of the two-phase system the information is written into the flip-flops in synchronization with the first clock signal $\phi 1$ and fed out therefrom in synchronization with the second clock signal $\phi 2$.

Most of the electronic calculators available today are of serial type wherein numeral information is temporarily stored in the register and then calculation is carried out on the serially-delivered numeral information from the register. The digit timing signals T1, T2 . . . T16 represent a time scale indicative of weights of digits in the case of viewing the information serially circulating through the register at the output terminal of the register, and designate the boundaries of each word time (16 digits in each word). The bit timing signals $t1$, $t2$, $t3$ and $t4$ are indicative of weights 8, 4, 2 and 1 respectively, in each digit.

Generators for these timing signals are, of course, constructed in the integrated circuit device. In particular, according to the preferred embodiments of FIGS. 1, 2, 6 and 7, the digit time signals T1 through T16 are utilized for distinction or identification between various key signals. And, a combination of these timing signals such as T16 $t4$ $\phi 1$ is used to establish a time reference within each word time.

Figures 1, 2:
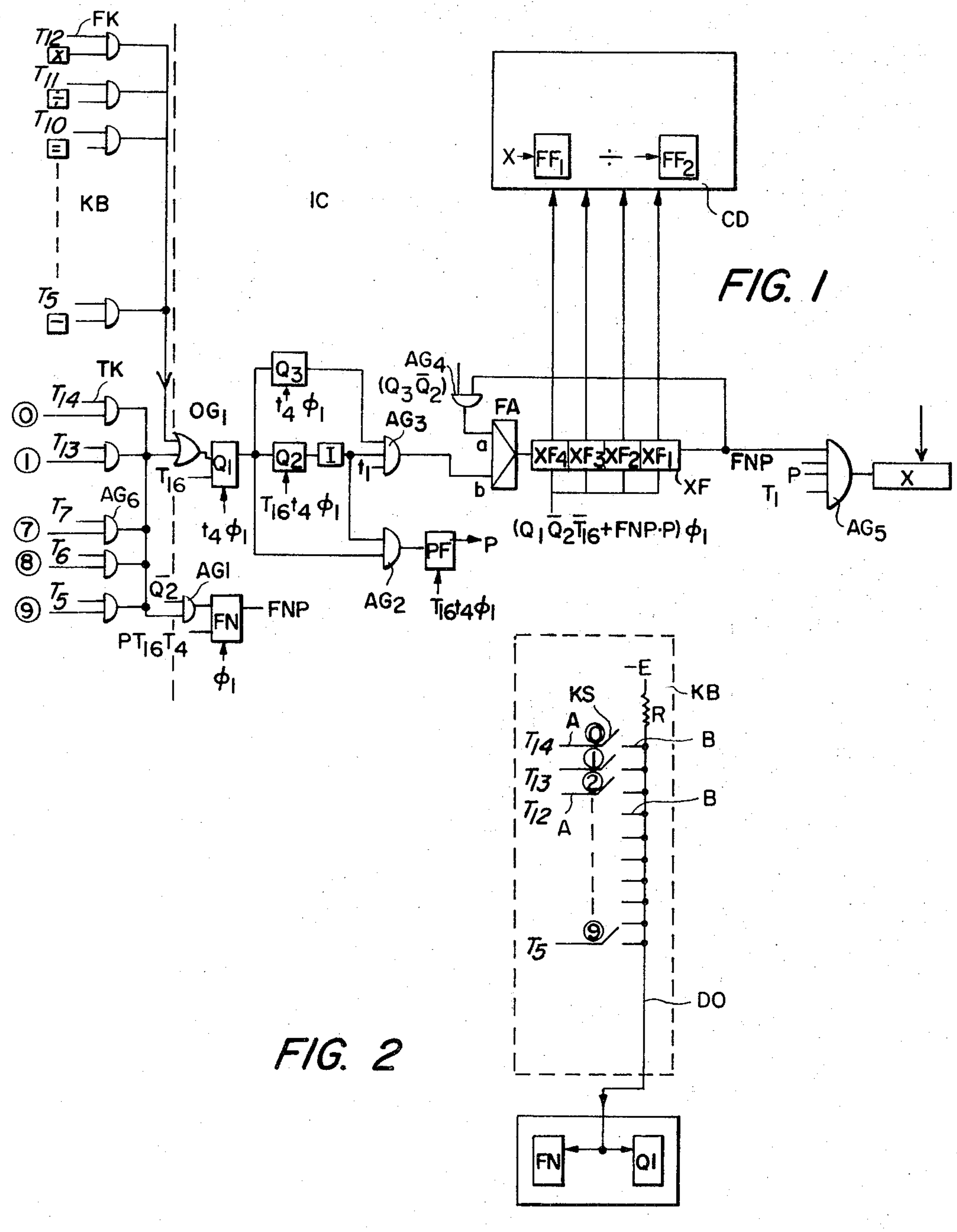
FIG. 1 is a schematic block diagram of the logic system including the key signal coupling arrangement of this invention.
FIG. 2 is a simplified representation showing key arrays of a key board used in accordance with this invention.

Referring now to FIG. 1, there is illustrated an exemplary calculating machine provided with a key board KB which contains manually operated digit keys 0 through 9 for the entering of numeral information in any sequence desired by the operator, and manually operated function keys ×, ÷, = — for the entering of functional information. An arithmetic unit CD is operatively connected with the key board KB and other apparatus for performing calculations such as for instance add, subtract, multiply, and divide on the entered numbers in accordance with the selected function keys. Each key 0 – 9, × ÷ — is connected to a respective AND gate AG6 of which one input is connected to any one of the above timing signals T1 through T16. All the outputs of the AND gates AG6 associated with the digit keys are commonly connected and all the gate outputs for the function keys also are commonly connected by a different wire. In this manner, when any one of the keys is selected, the selected key signal is delivered from the key board KB only during one digit timing signal.

The following is a still more detailed description of the key board circuit construction shown in FIG. 2. The individual key switch KS for each key has an end portion A connected to any one of the digit timing output signals T1 through T16 and another end portion B connected to a common output wire DO. The commonly-connected end portions B are further connected to a negative voltage source-E through a resistor R. In particular, the above circuit construction is so made that the digit keys 0 through 9 receive the digit timing signals T14 through T5 in an opposite order to their appearance in a train of the digit signals, since the timing signal T16·t4 is selected to establish the time boundary marker. For example, the digit key 1 designating the entering of the numeral 1 receives the digit timing signal T14, and the digit key 2 receives the digit timing signal T13. Similarly, the digit key 9 receives the digit signal T5. It will be appreciated from the above explanation that, when the digit key is selected, the time interval between the delivered key signal and the time boundary signal corresponds to the numeral designated by the selected key. Returning to FIG. 1, all of the keys are divided into a digit key section TK and a function key section FK in the key means KB. The common outputs of both the digit key and function key sections are connected to an OR gate OG1 which in turn has its output connected to a first flip-flop Q1 of R-S type within the integrated circuit device IC. It should be noted that such coupling between the key board KB and the integrated circuit device IC is accomplished by only two connecting wires. The flip-flop Q1 also receives as its reset input the last digit timing signal T16 which is operative in synchronization with the combination of timing signals $t4 \cdot \phi 1$ to reset flip flop Q1. Therefore, for example, if it is actuated to its set state at the timing T7 $t4\phi 1$ and then turned to its reset state at the timing T16 $t4\phi 1$, it remains the set state during nine digit periods (which correspond to the digit key 7, as will be understood from the following explanation). The flip-flop Q1 serves to assist in identifying the various key signals and, for this reason, provides its set output to three flip-flops Q2, Q3 and PF. These flip-flops Q2, Q3 and PF are of delay type.

The flip-flop Q3 which receives as its input the set output from the flip-flop Q1, is delayed to perform its set and reset operation by one digit period, and is operative to control the entering of the selected key signals into a main register X for storage. The flip-flop Q2 is set upon the appearance of the time boundary marker timing signals T16 $t4\phi 1$, and is not reset until the key signal disappears. Owing to such mode of operation of the flip-flop Q2, the key signal from the key board KB is entered into the register X only one time. Generally, the time period when an operator depresses the same key is in a range from several seconds to several $\mu$ seconds, whereas the calculator operates at a high speed of several $\mu$ seconds (that is, each word time). Under these circumstances an arrangement is required to prevent repeat of the read-in operation of the same key signal.

The flip-flop PF is set upon the appearance of the time boundary marker timing signal T16 $t4\ \phi\ 1$ in the case of establishing conditions of Q1 $\overline{Q2}$ with the resulting occurance of an arithmetic instruction signal P.

An AND gate AG3 receives the output $\overline{Q2}$ through an inverter I and the output Q3 to perform gating operations in distinguishing the selected key from the non-selected keys. The time interval Q3 $\overline{Q2}$ where the gate AG3 is opened corresponds to the numeral designated by the selected digit key.

According to the preferred embodiment of FIG. 1, such differences in time associated with distinguishing the selected key from the non-selected keys, are converted into a series of binary-coded signals (4 bits in FIG. 1) by means of an adder FA and an input buffer register XF consisting of 4-bit flip-flops XF1 through XF4. The AND gate AG3 receives as a third input the bit timing signals t1 which in turn are applied to a first input b of the adder FA only when the conditions Q3 $\overline{Q2}$ are detected. Moreover, the adder FA receives as its second input a the binary-coded outputs from the buffer register XF. In such manner the adder FA performs adding operations wherein the gated-on number of the bit timing signals t1 is counted so that the key signal through the common wire is converted into a series of the binary-coded signals of a specified code configuration corresponding to the selected key. As the above example, when the digit key 7 is selected the gate AG3 is opened during nine digit periods. In practice, the addition is inhibited to be carried out during the two digit time periods out of the nine digit periods. In other words, the previous contents of the buffer register XF should be pushed away during the first digit time period and the period of the last digit timing signal T16 provides room for the entering of numeral 0. As a result the time period of the gated-on digit intervals minus two digit intervals correctly corresponds to the number selected by the digit key.

Concurrently, the commonly-connected keys TK also are connected through an AND gate AG1 to a decision flip-flop FN of R-S type, which performs a decision as to whether the selected key signal is concerned with the digit key or the function key. In the case where the flip-flop FN is set the entering key signal is processed as the digit key information. The decision circuit FN receives the output from the gate AG1 and the timing signals P T16 T4 and delivers the output signal FNP indicating that the entered key signal is a digit key signal.

The contents of the buffer register XF circulate through a circulation path including an AND gate AG4 and the adder FA during the time period corresponding to the number selected by the digit key as discussed above, where the repeaded addition of the bit timing signal t1 takes place, and the contents of the buffer register XF are transferred to the main register X. An AND gate AG5 between the registers XF and X receives various signals FNP, P and T1. By the distribution operation of the AND gate AG5 the entered key signals in binary notification as to the digit key are applied to the storage register X, and the function key signals are in a parallel fashion transferred from the buffer register XF to an arithmetic control unit CD including conditional flip-flops FF1, FF2, etc. without the circulation through the buffer XF.

As mentioned previously, both the digit key information and the function key information are converted into the binary-coded signal series. Although the binary code configuration of the digit key information is directly indicative of the nature of the selected digit key to avoid the necessity of establishing an encoder circuit, the code configuration of the function key information is not directly related with the selected function. For this reason the encoder for the function information must be constructed between the buffer register XF and the conditional flip-flops FF1, FF2.

Figure 4A:
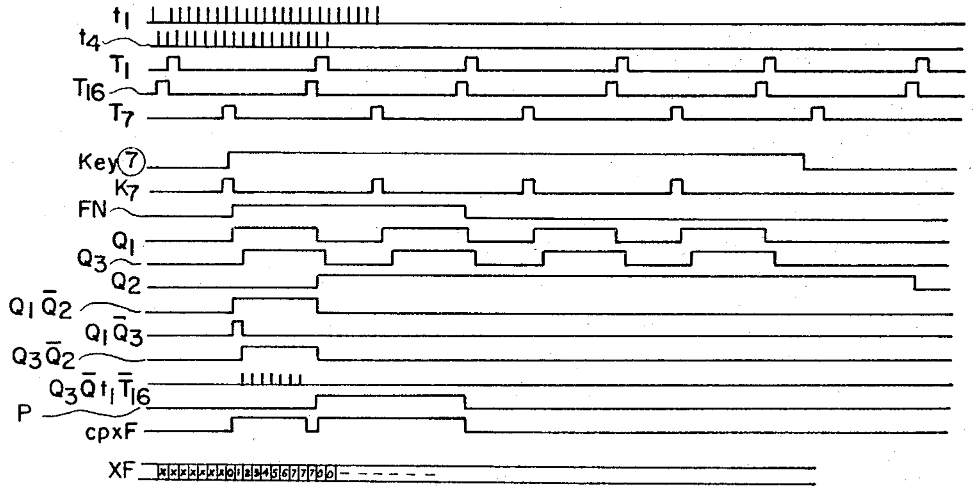
FIGS. 4 (A) and (B) are time charts illustrating the mode of operation of the key signal coupling arrangement in introducing digitized key signals into the integrated circuit device.

The mode of the entering of the digit key information will be described more clearly with reference to FIGS. 4 (A) and 4 (B). FIG. 4 (A) shows the mode of the entering of the digit key 7. t4 $\phi$ When the digit key 7 is manually operated, the key signal is delivered through the AND gate AG6 during the time period of the digit signal T7, causing the flip-flop Q1 to be set at the timing T7 $t4\ \phi$. Thereafter, the flip-flop Q1 is reset at the timing T16 - 4$\phi$1. In the case where the key signal from the key 7 continues to occur, the flip-flop Q1 is repeatedly set at the timing T7 $t4\ \phi$1. While the digit time signal T7 is applied to the flip-flop Q1, the flip-flop Q2 is in the reset state and the AND gate AG1 is actuated to set the flip-flop FN at the timing T7$\phi$1. The output FNP contributes in alternatively transmitting the key information to the register X or the arithmetic control unit CD.

The output from the flip-flop Q1 sets the flip-flop Q3 at the next digit timing T8t4$\phi$1. After setting of the flip-flop Q1 the clock pulses $\phi$1 are applied to the shift register XF to initiate its shift operation in order to enter new information thereto in response to the depression of the desired key (conditions of $Q1 \cdot \overline{Q2} \cdot \overline{T16} \cdot \phi 1$ ).

However, during four bit time periods before setting of the flip-flop Q3 the AND gate AG4 remains in the closed state due to the logic conditions Q3·Q2 with the result that the previous contents of the buffer register XF are completely cleared. At this time the buffer XF is ready for the entering of the selected digit key signal.

After that, upon the appearance of the output from the flip-flop Q3 the AND gate AG4 is allowed to open to establish the circulation loop between the output and input of the buffer XF, and the bit time signal t1 is operatively supplied to the one input b of the adder because of the logic conditions $\overline{Q2} \cdot Q3$ for the AND gate AG3. Since the above conditions are maintained during the time period from T8$t4\phi$1 to T16$t4\phi$, a total of eight bit signals t1 is supplied through the gate AG3 to the adder FA during the interval T9 through T16. As a result, the bit signals t1 are supplied as adder inputs and are repeatedly added to the contents of the least significant digit XF1 (all zero's, at first ) of the buffer register XF during the period T9 through T16. However, as explained previously with reference to the entry of the digit key 0, the shift operation of the buffer register XF is not carried out only during the period T16 to inhibit the addition of the bit signal $t$1. Thus, the addition is actually carried out seven times and the resultant binary-coded signal (0111) is entered and stored in the buffer register XF. After the flip-flop Q2 and PF are again set at the timing T16$t4\phi1$, the logic conditions for opening the AND gate AG3 are not satisfied and thus bit time signals are stopped and no further additions are affected by the adder FA.

Upon the appearance of the output P from the flip-flop PF the buffer register XF continues to shift its contents in response to the clock pulses$\phi1$. The AND gate AG5 also is opened so that the contents (0111) stored in the buffer XF are introduced into the least significant digit of the register X at the timing T1 to complete the read-in operation. As commonly known, the read-in operation of the next digit key is accomplished by the entering of the key signal into the second digit place of the main register with the left shift operation.

Figure 4B:
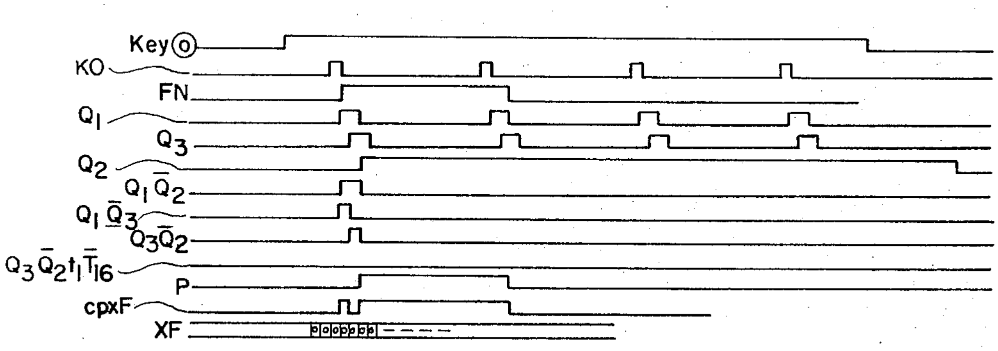

FIG. 4(B) shows the mode of the entering of the digit key 0. When the digit key 0 is depressed the key signal is delivered in syncronization with the digit signal T14 to set the flip-flop Q1 and FN at the timing T14$t4\phi1$. During the next digit time period $Q1\cdot\overline{Q3}$ the buffer XF is cleared and then the flip-flop Q3 is set at the timing T15$t4\phi1$. Since the flip-flop Q2 is set at T16$t4\phi1$, the logic states $Q3\cdot\overline{Q2}$ are viewed only the one digit time period T16. At this time, however, the clock pulses $\phi$ are not applied to the buffer register XF so that its contents remain at a value of (0000). The AND gate AG5 serves to transmit the contents (0000) from the buffer XF to the main register X.

In the case of depressing the function key × for instructing multiplication the binary-coded signals (0010) are entered into the buffer register XF in the same mode. These signals (0010) set the conditional flip-flop FF1 through an appropriate decoding circuit resulting in that routine for performing the multiplication. Thereafter, when the function key = is depressed the binary-coded signals (0100) are in a parallel fashion introduced into the buffer XF and then transferred to the arithmetic control CD. The calculator initiates the multiplication operation.

Figure 5:
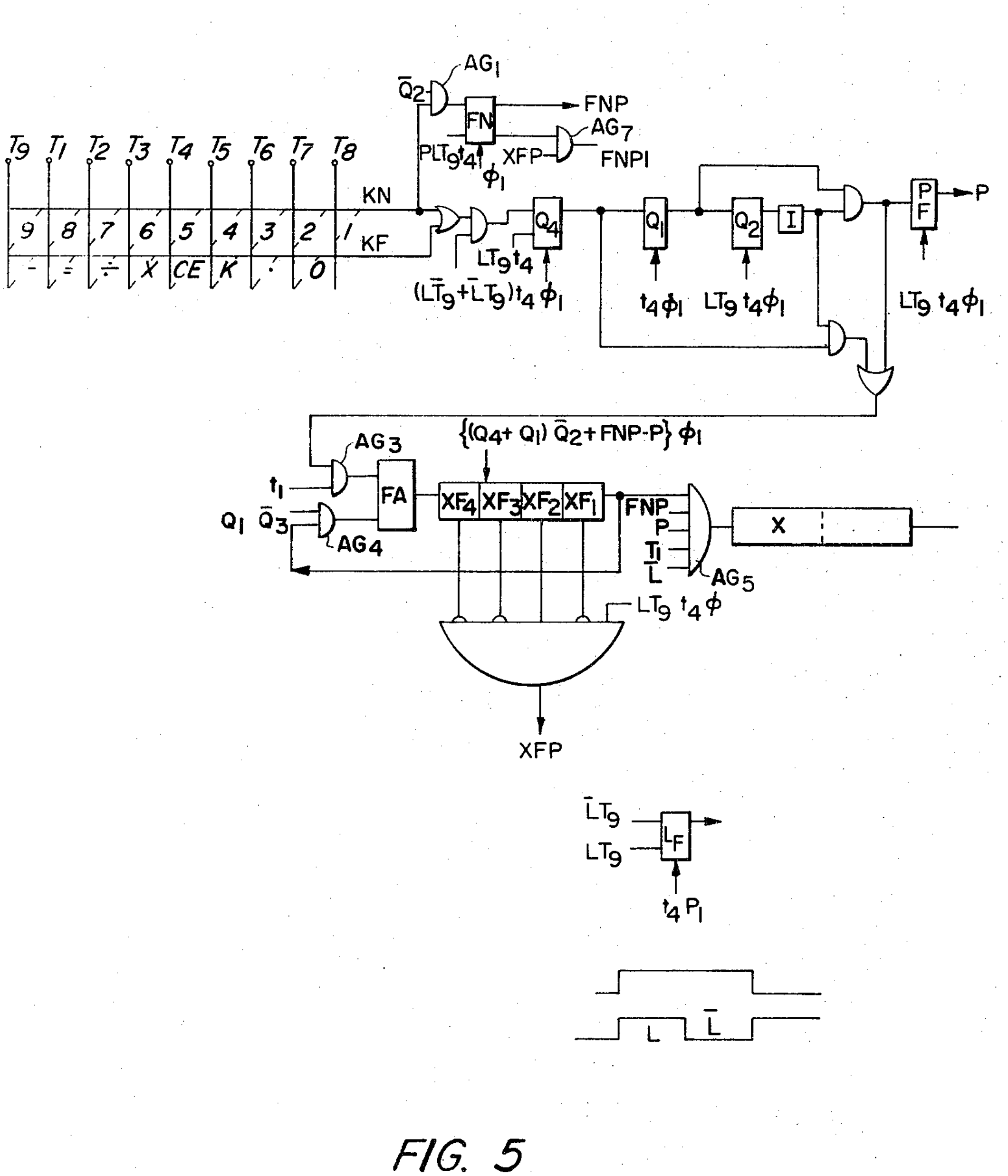
FIG. 5 is a schematic block diagram of another example of the key signal coupling arrangement constructed in accordance with the teachings of this invention.

Although the above example illustrates the key coupling arrangement appropriate for the calculator synchronized with 16 digit signals T1 through T16, the same operational principle may be applied to the portable type calculator wherein only nine digit signals are used to perform various arithmetic operations. FIG. 5 shows another embodiment wherein nine digit signals T1 through T9 is used while the main register X has a capacity of 18 digits. Such type of calculator is called "double-length" system wherein the separate signals L and $\overline{L}$ are adapted to make distinction between the upper eight digits and lower eight digits in the register X. For example, a combination $\overline{L}$T1 is indicative of the first digit and a combination LTi of the tenth digit.

The symbols used in FIG. 1 also are applied to the embodiment of FIG. 5. The circuit construction will be clear to anyone skilled in the art from the explanation with respect to FIG. 1. In this case the digit key 0 is arranged in the function key section.

Figure 6A:
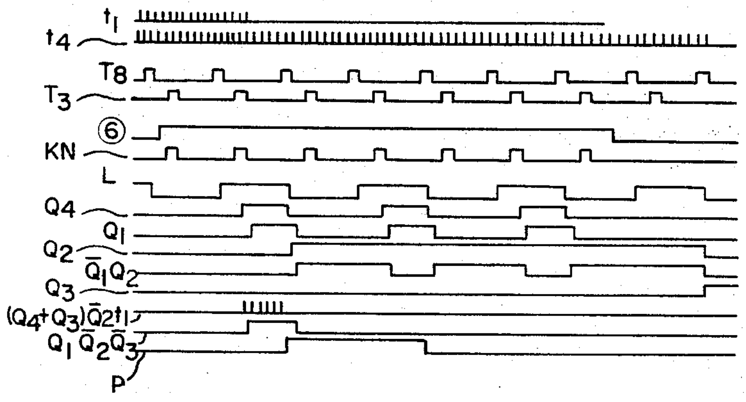
FIGS. 6 (A) through 6 (C) are time charts illustrating the mode of operation of the key signal coupling arrangement shown in FIG. 5.

When the digit key 6 is manually selected as shown in FIG. 6(A), the key signal KN is delivered to the integrated circuit device IC at LT3 to set the flip-flop Q4 at LT3$t4\phi1$. Simultaneously, the flip-flop FN is set upon the appearance of the logic state $\overline{Q2}$ to provide the signal FNP indicative of the selected key signal being concerned with the numeral information.

After the lapse of one digit period the set signal from the flip-flop Q4 set the flip-flop Q1 at LT4$t4\phi1$. When the flip-flop Q4 is in the set state, the buffer register XF performs the shift operation of its contents but the previous contents are pushed away because of the closed state of the AND gate AG4 in the circulation path (logic conditions, $Q4\ \overline{Q2}\ \phi$). Thereafter, the set conditions $(Q4+Q1)\cdot\overline{Q2}$ for the AND gate AG3 are established to allow the adder FA to receive the bit time signal t1 through the gate AG3 until the flip-flop Q2 is set at the timing LT9$t4\phi1$. In such manner the AND gate AG3 provides the adder FA with a total of six signals during the period from LT4 to LT9. However, it should be understood that the bit time signal $t1$ delivered at LT4$t1$ is not arithmetically added to the least significant bit XF1 of the buffer register with the results that the most significant bit XF4 stores the numeral 1 since the AND gate AG4 is de-energized in view of the logic conditions $Q4\cdot\overline{Q1}$. During the succeeding periods before the entering of the bit signal t1 at LT5$t1$ the AND gate AG4 remains in the closed atate and thus the contents of the buffer XF are shifted and become (0001). In other words, under the conditions $Q4\cdot\overline{Q1}$ new information is entered into the register XF instead of the previous contents. Hence the addition of the bit signal $ti$ is repeatedly carried out six times during the digit time intervals T4 through T9 and the binary-coded signals (0110) are entered into the buffer XF. The contents (0110) are transferred from the buffer XF to the main register X at LT9$t4\phi1$.

Figure 6B:
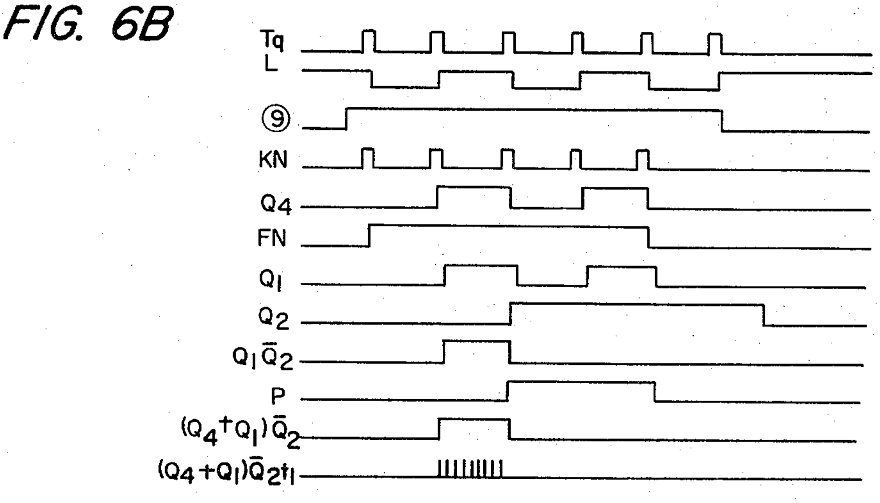
Figure 6C:
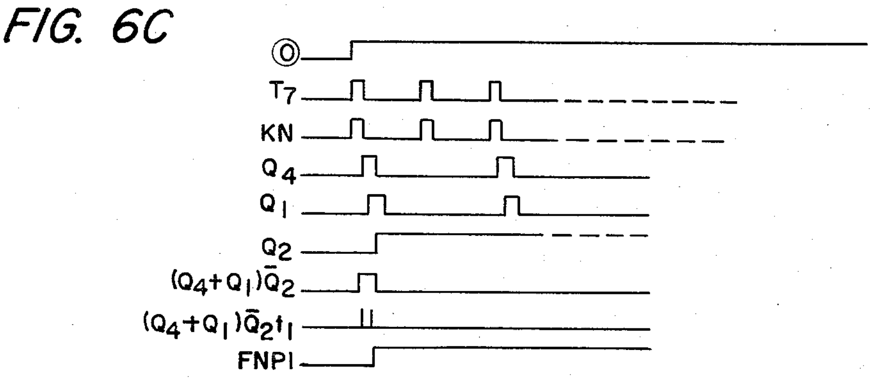

FIG. 6(B) illustrates the mode of entering of the key signal 9 and FIG. 6(C) entering of the key 0. In this case in FIG. 6(C) the flip-flop Q4 is set at LT7$t4\phi1$ causing the buffer register XF to store the coded signals (0010). In order to distinguish the selected key 0 from the key 2 the parallel outputs from the buffer register XF are inspected to detect whether the parallel outputs are (0010) and the detect output XFP occurs if affirmative. At the same time the flip-flop FN delivers the signal FNP1 to stop the entry of the clock signal $\phi1$ into the register XF. The signal FNP1 does not open the AND gate AG5 and thus the shift operation of the register XF is not carried out. Accordingly the binary-coded signals (0000) are entered into the register X.

Figure 7:
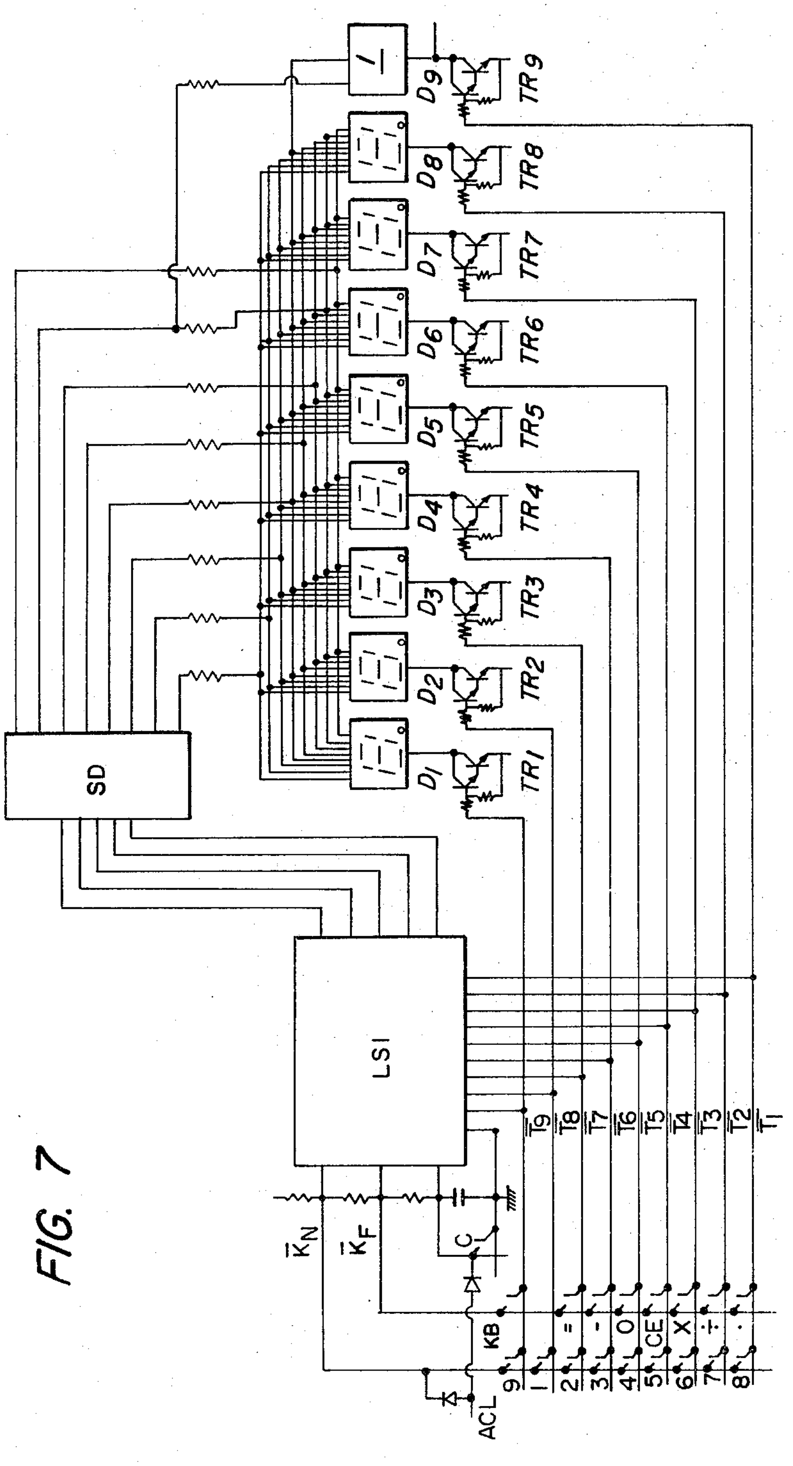
FIG. 7 is a schematic block diagram of an exemplary calculator embodying the key coupling arrangement shown in FIG. 5.

Referring now to FIG. 7 the entire construction of the portable type calculator embodying the key coupling arrangement of FIG. 5 generally contains the key board KB, the large-scale integrated circuit device LSI, which comprises the storage unit, arithmetic unit, arithmetic control unit and so forth, solid-state display unit (for example, light emitting diodes) D1 through D9. In the display type calculator the individual digit time signals T1 through T9 are separately led out from the large-scale integrated circuit device LSI through the respective connection terminals for time-sharing of the display unit. For the key signal coupling the difference in time associated the delivery of each key signal can be obtained from such connection terminals without increasing the expediture on the package terminals. In this drawings the symbols TR1 through TR9 designate time-sharing transistors and the symbol SD designates a segment driver circuit.

It will be apparent from the above explanation of examples of embodiments of this invention that any form of count modifying means such as a subtractor or counter circuit may be used instead of the adder FA in such a way that key signals delivered in synchronization with the corresponding digit time signal are converted into a series of the binary-coded signals. In the case of the counter, it unconditionally and repeatedly performs count operations irrespective of the appearance of the key signal, only when the key signal appears, the instantaneous contents of the counter are decoded into a series of binary-coded signals.

We claim:

1. A multiplexing connection arrangement for use between a keyboard and an integrated circuit device for entering individual key signals from the key switches of the keyboard into a storage register comprising a part of the integrated circuit device through a common multiplexed path requiring a minimal number of terminal connections to the integrated circuit device and utilizing timing signal generator means also included within the integrated circuit device for generating sets of individual timing signals and time boundary marker signals, the phases of which are sequentially shifted and do not overlap each other within specified intervals of time; said multiplexing connection arrangement comprising coupling circuit means coupled to the timing signal generator means and the key switches of the keyboard for coupling individual timing signals from the timing signal generator means through a common multiplexed path in response to the individual key signals from the key switches respectively at different points in time; counter means supplied by said coupling circuit means with the timing signals through a common multiplexed path; adder means coupled to said counter means and to said coupling circuit means for modifuing the count of the counter means in a predetermined code notation indicative of the encoded representation of respective operated keys in response to the timing signals and the individual key signals; and transfer means coupled to the counter means and to the timing signal generator means and responsive to the time boundary marker signals for transferring the contents of the counter means through a common multiplexed path into the storage register in the predetermined code notation.

2. A multiplexing connection arrangement for use between a keyboard and an integrated circuit device for entering individual key signals from the key switches of the keyboard into a storage register included within the integrated circuit device through a common multiplexed path and utilizing timing signal generator means comprising a part of the integrated circuit device for generating a train of individual timing signals including time boundary marker signals, the phases of which are sequentially shifted and do not overlap each other within specified intervals of time with the time boundary marker signals being indicative of the termination of a specified period of time; said multiplexing connection arrangement comprising coupling circuit means coupled to the timing signal generator means and the individual key switches for coupling individual key signal coded timing signals from the timing signal generator means through a common multiplexed path in response to the individual key signals; counter means supplied by said coupling circuit means with the key signal encoded timing signals through the common multiplexed path; count modifying means coupled to said counter means and to said coupling circuit means for modifying the count of the counter means in a predetermined code notation in response to the key signal encoded timing signals, the operation of said counter means being carried out during a period of time between the initiation of a respective timing signal produced in response to the actuation of an operated key and the time boundary marker signal; and transfer means coupled to the counter means and the timing signal generator means and responsive to the time boundary marker signal for transferring the contents of the counter means through a common multiplexed path into the storage register in the predetermined code notation.

3. A multiplexing connection arrangement according to claim 2, wherein the counter means comprises a multi-phase buffer storage for temporarily storing the results derived from the count modifying means and the count modifying means performs addition operations in synchronization with the timing signals.

4. A multiplexing connection arrangement according to claim 3, wherein the counter means further comprises gating means for enabling the addition operations during a period of time commencing with the timing signals initiated in response to the actuation of an operated key and terminating with the time boundary marker signal.

5. A multiplexing connection arrangement according to claim 4 wherein the count modifying means receives adder inputs during each period of the timing signals and then effects repeated additions in response to the inputs.

6. A multiplexing connection arrangement according to claim 5, wherein the count modifying means is of binary fashion type and the key signals via the common multiplexed path are directly translated into input information in the form of a plurality of binary bits, the number of which are dependent upon the differences in the points in time between the initiation of the key signal from the keyboard and the key time marker boundary signal.

7. A multiplexing connection arrangement according to claim 6 further comprising a flip flop for activating the gating means and which is set by the initiation of a key signal and reset by the time boundary marker signal.

8. A numeral input apparatus for entering a plurality of key signals from a keyboard into a storage register within an integrated circuit device through a common multiplexed path in selected sequence by translating them into multi-digit numeral information with each digit consisting of a plurality of binary bits, and with said keyboard comprising a plurality of key switches for providing numeral key signals; said input apparatus comprising timing signal generator means for generating separate sets of timing signals the phases of which are sequentially shifted and do not overlap each other within a specified period of time, said timing signal generator means including means for generating a time boundary marker signal indicative of the termination of the specified period of time; coupling means coupled to the timing signal generator means and the key switches for supplying only the individual set of timing signals associated with the actuation of a respective key switch and occurring at different points in time without overlap in time therebetween through a common multiplexing path; binary addition means coupled to the coupling circuit means and to said timing signal generator means and responsive to the timing signals for performing binary addition in response to each entered numeral key signal, during a period of time commencing at the initiation of a timing pulse produced in response to actuation of an operated key and terminating with the time boundary marker signal; counter means coupled to the binary addition means and responsive thereto for translating each numeral key signal into numerical information in the form of a single digit having a corresponding binary code representation consisting of a plurality of binary bits; and transfer means coupled to the counter means and to the timing signal generator means and responsive to the time boundary marker signal for transferring the results of the counter means indicative of the operated key into the storage register in the binary code decimal notation.

9. A numeral input apparatus according to claim 8 wherein the addition performed by the addition means is inhibited when the key signals are indicative of numeral zero.

10. A functional information input apparatus for entering over a common multiplex path a plurality of key signals concerning the nature of arithmetic functions from a keyboard into a storage register within an integrated circuit device by translating the signals into functional information consisting of a plurality of binary bits having a corresponding binary code representation indicative of an operated key, said keyboard comprising a plurality of functional key switches for providing functional key signals representative of the actuation of respective functional key switches; said input apparatus comprising timing signal generator means for generating separate sets of timing signals the phases of which are sequentially shifted and do not overlap each other within a specified period of time and for further generating time boundary marker signals indicative of the termination of the specified period of time; coupling means coupled to the timing signal generator means and the key switches for intercoupling the individual sets of timing pulses with the functional key signals from the key switches respectively thereby to lead out the individual functional key signals at different points in time from the keyboard without overlap in time therebetween on a common multiplex path; binary addition means coupled to the coupling means and responsive to the timing signals for performing binary additions with each entered functional key signal, during a period of time commencing at the initiation of a timing signal associated with the actuation of an operated key and terminating with the boundary marker signal; counter means coupled to the binary addition means and responsive thereto for translating the functional key signal into information in the form of a single digit having corresponding binary code representation consisting of a plurality of binary bits; and transfer means coupled to the counter means and to the timing signal generator means and responsive to said time boundary marker signal for transferring the results of the binary addition means stored in said counter means into said storage register.

11. A multiplexing connection arrangement for use in connecting a keyboard and an integrated circuit device for entering individual key signals from the keyboard representative of desired numeral and functional information into a storage register through a common multiplexing path, the integrated circuit device including computation means for acting on the numeral and functional information, the storage register being incorporated within the integrated circuit device for storing the key signals entered therein in a predetermined code notation, said integrated circuit device further including timing signal generator means for generating separate sets of timing signals and time boundary marker signals the phases of which are sequentially shifted and do not overlap each other within a specified period of time, and said keyboard comprising a plurality of key switches for providing individual key signals, the key switches being divided into a group of digit keys for entering numeral key signals and another group of function keys for entering functional key signals; said multiplexing connection arrangement comprising first coupling means coupled to the timing signal generator means and the group of digit key switches for coupling the individual timing signals with the key signals from the digit key switches respectively thereby to lead out individual sets of digit key signals at different points in time from the keyboard without overlap in time therebetween on a common multiplex path; second coupling means coupled to the timing signal generator means and the group of functional key switches respectively thereby to lead out individual sets of functional key signals at different points in time from the keyboard without overlap in time therebetween on the common path; detector means connected with the first and the second coupling means for determining whether the led out key signals are concerned with digit key signals or function key signals; counter means coupled to said first and second coupling means and responsive to the timing signals, adder means coupled to the counter means and to the first and second coupling means for modifying the count stored in the counter means in a predetermined code notation in response to the timing signals with the operation thereof being controlled by the led out digit and functional key signals; and transfer means responsive to said time boundary marker signals and said detector means for transferring the contents of the counter means indicative of the encoded representations of the operated digit and function keys into the storage register in the predetermined code notation.

12. An electronic calculator comprising a keyboard having a plurality of key switches for entering key signals into the calculator; an integrated circuit device including a storage register for storing key signals entered therein said keyboard in a predetermined code notation and timing signal generator means for generating a train of timing signals the phases of which are sequentially shifted and do not overlap each other within a specified period of time; common coupling means coupled to the timing signal generator means within the integrated circuit device and to the key switches on the keyboard for coupling the individual timing signals in response to actuation of the key switches respectively thereby to lead out individual key signals at different points in time from the keyboard without overlap in time therebetween through a common multiplexed path; counter means coupled to said common coupling means; count modifying means coupled to said counter means and said common coupling means and responsive to the key signal encoded timing signals for modifying the stored count of said counter means in a predetermined code notation in response to the key signal encoded timing signals, the operation of the count modifying means being responsive to the key signal encoded timing signals led out in response to operated keys of the keyboard; transfer means coupled to the counter means and the timing signal generator means for transferring the contents of the counter means indicative of the encoded representation of the operated key into the storage register in the predetermined code notation; and display means coupled to the timing signal generator means and to the storage register for displaying the contents stored in the storage register.

13. An electronic calculator according to claim 12 wherein the number of the timing pulses in each set of timing signals is less than the digit capacity of the storage register, said calculator further includes means for generating separation signals adapted to distinguish between digit key signals and function key signals in the storage register, and the individual key signals are led out at different points in time from the keyboard by utilizing combinations of the timing pulses and the separation signals.

14. In a multiplexing connection arrangement between a keyboard and an integrated circuit device for entering individual key signals from the keyboard into a storage register through a common multiplexed path, the storage register being incorporated within the integrated circuit device for storing the signals entered therein in a binary code notation; said multiplexing connection arrangement comprising means coupled to the keyboard for deriving individual key signals led out from the keyboard at different points in time with the use of separate sets of timing signals and time boundary marker signals the phases of which are sequentially shifted and do not overlap each other within a specified period of time; common multi-stage counter means coupled to the coupling means; adder means coupled to the counter means and to the coupling means for modifying the count stored in the counter means in binary notation in response to the individual key signal encoded timing signals supplied to the counter means by said coupling means; and transfer means coupled to the counter means and responsive to the time boundary marker signal for transferring the contents of the counter means indicative of the binary encoded representation of a respective operated key as input information in the form of a plurality of binary bits into the storage register.

* * * * *